United States Patent [19]
Sopori

[11] Patent Number: 5,639,520
[45] Date of Patent: Jun. 17, 1997

[54] APPLICATION OF OPTICAL PROCESSING FOR GROWTH OF SILICON DIOXIDE

[75] Inventor: Bhushan L. Sopori, Denver, Colo.

[73] Assignee: Midwest Research Institute, Kansas City, Mo.

[21] Appl. No.: 592,600

[22] Filed: Jan. 26, 1996

Related U.S. Application Data

[63] Continuation of Ser. No. 314,193, Sep. 28, 1994, abandoned.

[51] Int. Cl.$^6$ ....................................................... B05D 3/06
[52] U.S. Cl. ......................... 427/595; 427/255; 427/255.4
[58] Field of Search .............................. 427/595, 255.4, 427/255, 167; 437/239

[56] References Cited

U.S. PATENT DOCUMENTS

| | | | |
|---|---|---|---|
| 4,109,030 | 8/1978 | Briska et al. | 427/255 |
| 4,181,751 | 1/1980 | Hall et al. | |
| 4,371,587 | 2/1983 | Peters . | |
| 4,419,385 | 12/1983 | Peters . | |
| 4,495,218 | 1/1985 | Azuma et al. | |
| 4,631,199 | 12/1986 | Hall et al. | |
| 4,702,936 | 10/1987 | Maeda et al. | |
| 5,009,926 | 4/1991 | Fukuda | 427/255.4 |
| 5,028,560 | 7/1991 | Tsukamoto et al. | 437/81 |
| 5,330,935 | 7/1994 | Dobuzinsky et al. | 437/239 |

FOREIGN PATENT DOCUMENTS

| | | |
|---|---|---|
| 4-2127 | 1/1992 | Japan . |
| 5-251428 | 9/1993 | Japan . |

*Primary Examiner*—Roy V. King
*Attorney, Agent, or Firm*—Edna M. O'Connor; Ken Richardson

[57] ABSTRACT

A process for producing a silicon dioxide film on a surface of a silicon substrate. The process comprises illuminating a silicon substrate in a substantially pure oxygen atmosphere with a broad spectrum of visible and infrared light at an optical power density of from about 3 watts/cm$^2$ to about 6 watts/cm$^2$ for a time period sufficient to produce a silicon dioxide film on the surface of the silicon substrate. An optimum optical power density is about 4 watts/cm$^2$ for growth of a 100Å–300Å film at a resultant temperature of about 400° C. Deep level transient spectroscopy analysis detects no measurable impurities introduced into the silicon substrate during silicon oxide production and shows the interface state density at the SiO$_2$/Si interface to be very low.

17 Claims, 1 Drawing Sheet

APPLICATION OF OPTICAL PROCESSING FOR GROWTH OF SILICON DIOXIDE

This is a Continuation of application Ser. No. 08/314,193 filed Sep. 28, 1994, now abandoned.

The United States Government has rights in this invention under Contract No. DE AC36-83CH10093 between the United States Department of Energy and the National Renewable Energy Laboratory, a division of the Midwest Research Institute.

BACKGROUND OF THE INVENTION

I. Field of the Invention

The present invention relates to a process for growing a layer of high quality silicon dioxide on the surface of a silicon substrate at a relatively low temperature by illuminating the substrate with a broad spectrum of visible and infrared light in a substantially pure oxygen atmosphere.

II. Description of the Prior Art

Thin films of silicon dioxide are used extensively in a myriad of electronic devices exemplified by metal oxide semiconductors (MOS) and photovoltaic devices including solar cells and optical detectors. A silicon dioxide film functions not only as an insulator, but also as a surface passivating medium. Substantially all high efficiency solar cells use a thin layer of silicon dioxide to minimize surface recombination. It is therefore evident that silicon dioxide is an extremely important component of electronic devices.

Currently, there is considerable interest in reducing the thickness of silicon dioxide films to a range of 100Å–300Å. However, there have been difficulties in obtaining high quality, thin silicon dioxide films by conventional wet or dry oxidation. A typical current method for growing silicon dioxide by oxidation is employment of a thermal furnace wherein the silicon dioxide is produced on the substrate at temperatures of 850° C. to 1,000° C. and higher. In addition to being quite energy-inefficient, such a high-temperature furnace process requires utmost cleanliness of the furnace chamber, a requirement that many times is difficult to maintain.

Recently there has been considerable interest in using rapid thermal annealing (RTA) processes for deposition of thin silicon oxide film on silicon substrates. A popular approach is to use $N_2O$ and silane for this purpose. Typically, these films are deposited at about 850° C. Silicon dioxide films have also been grown by RTA processes at conventional furnace temperatures as recited above, with the results being similar to conventional furnace-produced oxides.

Other prior art methods typically employ a chemical vapor deposition process in combination with ultraviolet radiation, such as from a mercury lamp, to deposit an oxide on a substrate. The radiation is an energy source which dissociates constituent reactants such as silane, $N_2O$, etc. in the ambient to produce favorable reactions that produce the desired oxide for deposition.

In view of the above-described approaches for the production of silicon dioxide, it is apparent that a need is present for silicon dioxide production on a silicon substrate wherein such production is accomplished in a straight forward manner at a relatively low temperature with high-quality yields. Accordingly, a primary object of the present invention is to provide a process for producing a layer of silicon dioxide on a silicon substrate using optical processing wherein the substrate itself is the source of the silicon component of the silicon dioxide so produced.

Another object of the present invention is to provide a method for producing the layer of silicon dioxide by using a broad spectrum of visible and infrared light to illuminate the silicon substrate, with such optical energy being the sole heat source for reactivity.

Yet another object of the present invention is to provide a method for producing the silicon dioxide layer whereby reactivity occurs in an oxygen atmosphere such that silicon of the silicon substrate itself is consumed to thereby produce a silicon dioxide layer on the substrate.

These and other objects of the present invention will become apparent throughout the description of the invention which now follows.

SUMMARY OF THE INVENTION

The present invention is a process for producing a silicon dioxide film on a surface of a silicon substrate. The process comprises illuminating a silicon substrate in a substantially pure oxygen atmosphere with a broad spectrum of visible and infrared light at an optical power density of from about 3 watts/cm$^2$ to about 6 watts/cm$^2$ for a time period sufficient to produce a silicon dioxide film on the surface of the silicon substrate. It has been found that an optimum optical power density is about 4 watts/cm$^2$ for growth of a 100Å–300Å film at a resultant temperature of about 400° C. At this optimum power density, a silicon dioxide film of about 100Å is produced within about one minute and nearly a 200Å film within about two minutes. Thereafter, growth subsides, with film thickness at about 250–300Å after about five minutes. Power densities greater than about 6 watts/cm$^2$ result in a diminished growth (less than about 100Å) and a temperature generation of about 550° C. Total heat generation is from illumination, and the increased heat produced at higher power densities perhaps substantially transforms the process to a more conventional prior-art furnace-type oxide production described earlier.

General factors that influence the growth of a silicon dioxide film on a silicon substrate include substrate (wafer) temperature, oxidation time, ambient composition, mechanical stress in the film, and dissociation of molecular oxygen into monatomic species. In the present process it has been clearly found that the growth rate of the optically grown silicon dioxide is very high, even as compared to conventional thermally-grown oxide produced at high temperatures. Since the substrate temperature reached in the present process employing optical excitation is low and is a cold wall process, the quality of silicon dioxide produced is extremely high since the above-listed factors influencing growth are favorable. Deep level transient spectroscopy (DLTS) analysis has shown that no measurable impurities are introduced into the silicon substrate during oxide production and that the interface state density at the $SiO_2$/Si interface is very low.

DETAILED DESCRIPTION OF THE PREFERRED EMBODIMENT

Figure 1:
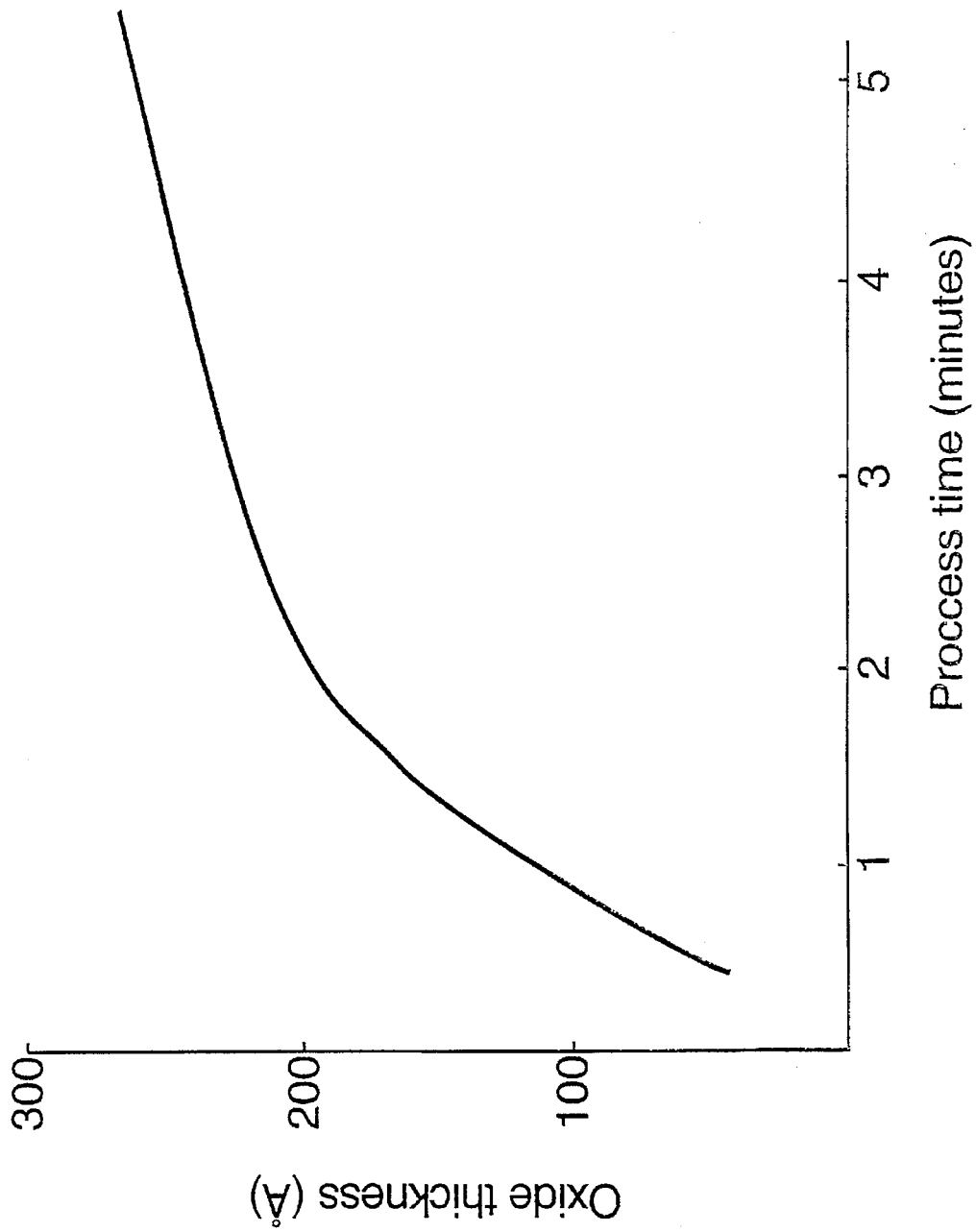
FIG. 1 is a graph showing the thickness of silicon dioxide film production in relation to time of processing at an optical power density of about 4 watts/cm$^2$.

The present invention is a process for the production of a silicon dioxide film on a surface of a silicon substrate, as exemplified by the following Examples which relates optimum conditions as now anticipated.

EXAMPLE I

A silicon wafer was placed within a quartz chamber as described in copending U.S. patent application Ser. No. 08/155,356, filed Jan. 18, 1994, and incorporated herein by reference, and the chamber was provided with tungsten-halogen illumination producing a broad spectrum of visible and infrared light. An oxygen atmosphere of 99.999% purity was provided to the chamber and the wafer was illuminated at 60 volt activation and power density of 4 watts/cm$^2$ which produced a temperature of about 400° C. As shown in FIG. 1, initial film growth is rapid, with about 100Å thickness after only one minute and nearly 200Å after about two minutes. As is apparent from the graph of FIG. 1, a silicon dioxide film having a thickness less than about 100Å can be attained by reducing processing time below one minute. Thus, for example, if a silicon dioxide film of about 50Å thickness is desired, that film can be produced in about 25–30 seconds.

EXAMPLE II

With the same processing as described in Example I, and as referenced in the copending application earlier cited, fabrication of Schottky diodes for material characterization was performed. Specifically, a clean silicon wafer was provided having a 3,000Å layer of aluminum deposited on its backside. The aluminum was alloyed to the wafer in accord with the referenced copending application. Thereafter, the quartz chamber was provided with an oxygen atmosphere and the description of Example I was followed for one minute. Finally, an aluminum layer of about 2,000Å was applied on the front side of the wafer through a mask. The resulting product exhibited low leakage currents and breakdown voltages exceeding 100 volts even on a low resistivity (0.4 Ω-cm) substrate which corresponds to an electric field of $10^8$ V/cm. DLTS analysis showed unmeasurable impurity content. Electron beam induced carrier yield was at least as good as that of a high quality junction device. Excellent stability has been observed after a long exposure to high intensity light that is rich in UV content.

It is to be noted that future MOS technologies are expected to require gate oxides in the 50–100Å range with excellent electrical properties and high reliability. The requirements of small thickness and high quality of the oxide are not efficiently compatible with conventional thermal processing that generally requires oxidation temperatures exceeding 900° C. Therefore, it is evident that the present process employing optical excitation and an oxygen atmosphere to produce high quality silicon dioxide film at a low temperature efficiently fulfills future fabrication specifications. It is to be noted that additional processing can include annealing the silicon dioxide film in a hydrogen-containing ambient to further improve interface density.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

I claim:

1. A process for producing a silicon dioxide film on a surface of a silicon substrate, the process comprising illuminating the silicon substrate in a substantially pure oxygen atmosphere with a spectrum of visible and infrared light at an optical power density of from about 3 watts/cm$^2$ to about 6 watts/cm$^2$ for a time period sufficient to produce with substantially no impurities the silicon dioxide film on the surface of the silicon substrate at temperatures less than 900° C.

2. A process as claimed in claim 1 wherein illuminating the silicon substrate heats the substrate to a temperature of about 400° C.

3. A process as claimed in claim 1 wherein the optical power density is about 4 watts/cm$^2$.

4. A process as claimed in claim 1 wherein the time period is sufficient to produce a silicon oxide film having a thickness of from about 100Å to about 300Å.

5. A process as claimed in claim 4 wherein the time period is from about 1 to about 5 minutes.

6. A process for producing a silicon dioxide film on a surface of a silicon substrate, the process comprising illuminating the silicon substrate in a substantially pure oxygen atmosphere with a spectrum of visible and infrared light at an optical power density sufficient to produce with substantially no impurities the silicon dioxide film on a surface of the silicon substrate at temperatures less than 900° C.

7. A process as claimed in claim 6 wherein illuminating the silicon substrate heats the substrate to a temperature of about 400° C.

8. A process as claimed in claim 6 wherein the optical power density is from about 3 watts/cm$^2$ to about 6 watts/cm$^2$.

9. A process as claimed in claim 8 wherein the optical power density is about 4 watts/cm$^2$.

10. A process as claimed in claim 8 wherein the silicon dioxide film has a thickness from about 100Å to about 300Å.

11. A process as claimed in claim 10 wherein the film is produced in a time period of from about 1 to about 5 minutes.

12. A method of surface passivating a silicon device by exposing the silicon device to an atmosphere of substantially pure oxygen while also exposing the silicon device to an optical flux comprising light in both the visible and infrared spectrums for a sufficient time and at a sufficient optical power density to produce a silicon dioxide film with substantially no impurities to a thickness in the range of about 50–300Å on the silicon device at temperatures less than 900° C.

13. The method of claim 12, including the step of maintaining the optical flux at a power density that produces temperatures in the silicon device less than about 550° C. during production of said silicon dioxide film.

14. The method of claim 12, including the step of maintaining the optical flux at a power density that produces a temperature in the silicon device of about 400° C. during production of said silicon dioxide film.

15. The method of claim 12, including the step of maintaining the optical flux at power density in the range of about 3–6 watts/cm$^2$.

16. The method of claim 12, including the step of maintaining the optical flux at power density of about 4 watts/cm$^2$.

17. The method of claim 15, including the step of exposing said silicon device to said optical flux for a time period in the range of about 25–60 seconds.

* * * * *